United States Patent
Seo

(10) Patent No.: US 7,371,656 B2
(45) Date of Patent: May 13, 2008

(54) METHOD FOR FORMING STI OF SEMICONDUCTOR DEVICE

(75) Inventor: Young Hun Seo, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 211 days.

(21) Appl. No.: 11/024,439

(22) Filed: Dec. 30, 2004

(65) Prior Publication Data
US 2005/0142799 A1    Jun. 30, 2005

(30) Foreign Application Priority Data
Dec. 31, 2003    (KR) .................. 10-2003-0101126

(51) Int. Cl.
*H01L 21/76*    (2006.01)
(52) U.S. Cl. ................ 438/429; 257/E21.546
(58) Field of Classification Search ........... 438/429; 257/E21.546
See application file for complete search history.

(56) References Cited

U.S. PATENT DOCUMENTS

| 6,221,733 B1 * | 4/2001 | Li et al. ............. 438/424 |
| 2005/0009295 A1 * | 1/2005 | Chan et al. ......... 438/429 |
| 2005/0095807 A1 * | 5/2005 | Xiang ............... 438/424 |

FOREIGN PATENT DOCUMENTS

KR    2002019287 A    *    3/2002

* cited by examiner

*Primary Examiner*—Bradley K Smith
(74) *Attorney, Agent, or Firm*—Lowe Hauptman Ham & Berner LLP

(57) ABSTRACT

A method for forming a STI of a semiconductor device includes steps of sequentially forming a pad oxide film and a pad nitride film on the semiconductor device and carrying out a pattern process PR; etching the pad oxide film and the nitride film and carrying out a cleaning process; selectively growing epitaxial silicon; and carrying out liner oxidation on the epitaxial silicon and carrying out CMP so as to form an oxidation fill and STI.

3 Claims, 3 Drawing Sheets

METHOD FOR FORMING STI OF SEMICONDUCTOR DEVICE

BACKGROUND OF THE INVENTION

1. Field of the Invention

The present invention relates to a method for forming shallow trench isolation (STI) of a semiconductor device, and more particularly, to a method for easily forming a top rounded corner during the STI process when manufacturing a transistor of a semiconductor device so as to enhance junction leakage and isolation characteristics.

2. Discussion of the Related Art

Generally, as semiconductor devices become more highly integrated and miniaturized while having higher speeds, more improved junction leakage and insulation characteristics are demanded.

FIG. 1 illustrates a diagram showing a conventional process for forming a STI in a conventional semiconductor device. Referring to FIG. 1, an oxide film and a nitride film are successively deposited on a silicon substrate S1. Then, a pattern is formed on the nitride film, the nitride film and the oxide film are etched, and then silicon used for the STI is etched. Thereafter, a filing oxide film S3 is formed and a trench is deposited on a liner oxide film S2. Subsequently, chemical mechanical planarization (CMP) is performed and the nitride film is removed so as to form the STI. In this case, and as recognized by the present inventor, if the top corner of the liner oxide film S2 is not rounded after etching the silicon used for STI and completing the formation of the liner oxide film, a current is concentrated to a portion which is not rounded, thereby causing a problem of unacceptably high leakage characteristics.

As recognized by the present inventor an anomaly in a voltage characteristic of certain transistors is described as a "double hump" characteristic. The present inventor was able to associate this double hump characteristic with the lack of rounded edges at the top corner of the liner oxide film S2.

SUMMARY OF THE INVENTION

Accordingly, the present invention is directed to a method for forming a STI for a semiconductor device that substantially obviates the above-identified and other problems due to limitations and disadvantages of the related art.

An object of the present invention is to provide a method for forming STI of a semiconductor device, in which top corner rounding is easily carried out during the STI process while manufacturing a transistor of a semiconductor device so as to enhance junction leakage and isolation characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for forming STI of a semiconductor device includes the steps of preparing a semiconductor substrate having an active region and a field region defined thereon; forming a pad oxide film and a pad nitride film on the semiconductor substrate; selectively etching the pad oxide film, the pad nitride film and the semiconductor substrate on the field region to form a trench; selectively growing an epitaxial silicon layer on a surface of the trench; forming a liner oxide layer on the epitaxial silicon layer; and forming a STI in the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a structure and function of the present invention will be described referring to the appended drawings. FIGS. 2A-2D illustrate a diagram showing a process of forming a STI of a semiconductor device. In other words, referring to FIG. 2A, a silicon substrate (SS1) is prepared, wherein the substrate has an active region and a field region thereon. A pad oxide film (SS2) and a nitride film (SS3) are sequentially formed on the silicon substrate (SS1), and a photoresist pattern (SS4) is formed on the pad nitride film (SS3) above the active region.

Figure 1:
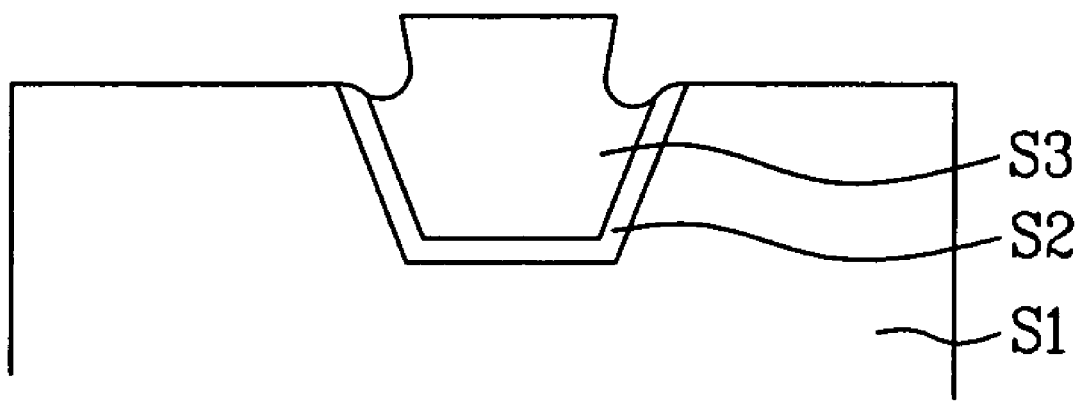
FIG. 1 illustrates a process for forming shallow trench isolation (STI) of a conventional semiconductor device.
Figure 2A:
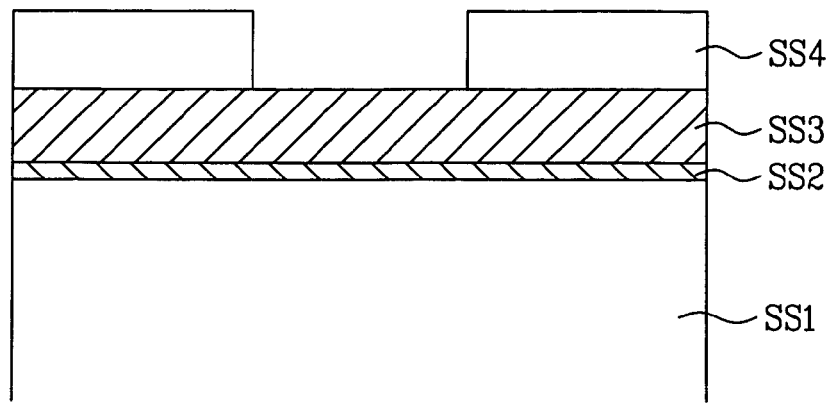
FIGS. 2A-2D illustrate a process for forming a shallow trench isolation (STI) of a semiconductor device in accordance with the present invention.
Figure 2B:
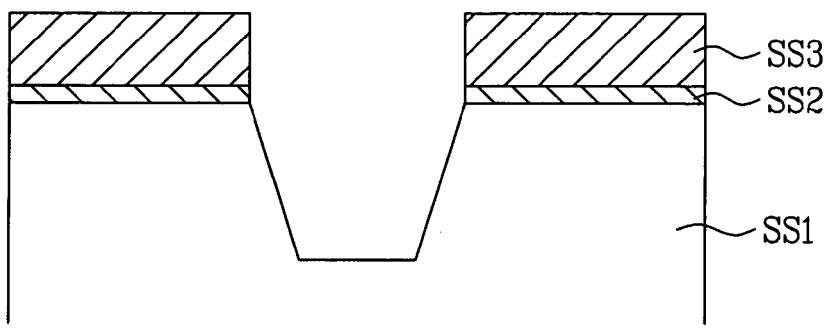

As illustrated in FIG. 2B, the pad oxide film (SS2) and the pad nitride film (SS3) above the field region are etched using the photoresist pattern (SS4) as a mask. And the substrate (SS1) of the field region is etched to form a trench. The photoresist pattern (SS4) is removed.

Figure 2C:
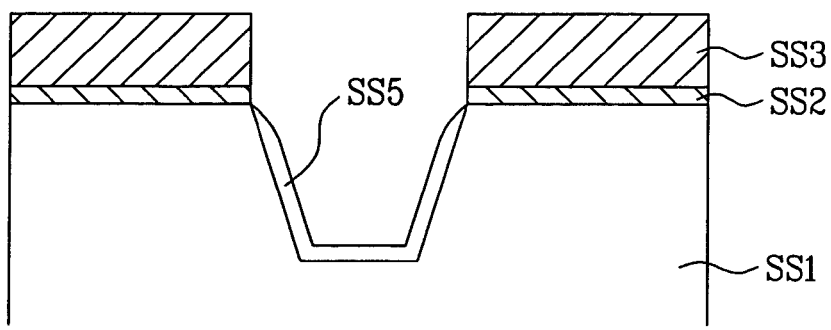

Subsequently, after the cleaning is carried out, as illustrated in FIG. 2C, epitaxial silicon (SS5) is grown on a surface of the trench. In this case, since the epitaxial silicon (SS5) is not grown in an edge region, a top thereof is naturally rounded as illustrated in FIG. 2C.

Figure 2D:
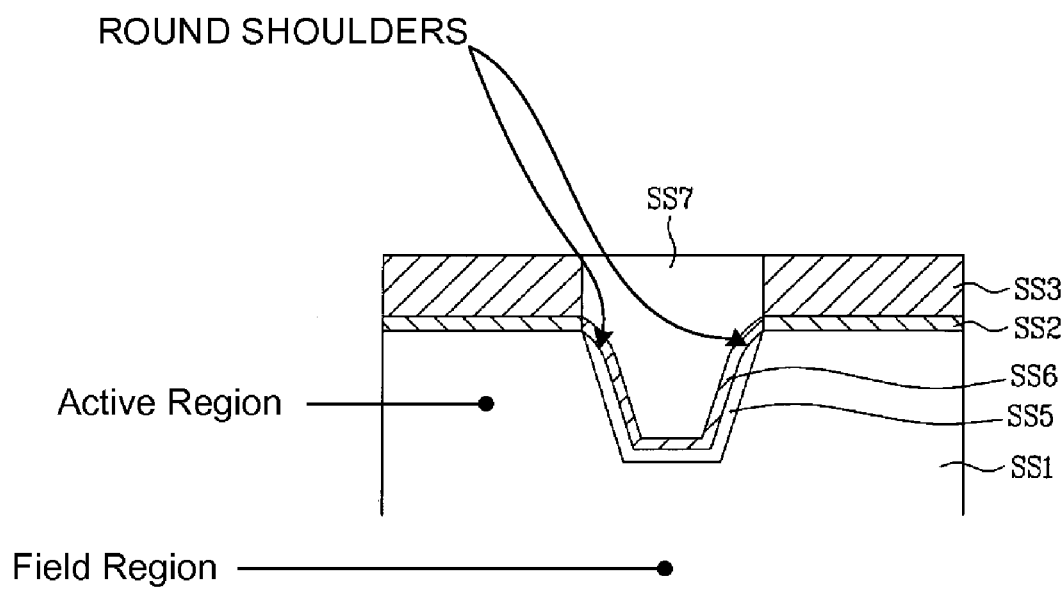

Next, referring to FIG. 2D, after the epitaxial silicon (SS5) is grown, the liner oxide layer (SS6) is formed on the epitaxial silicon (SS5). Subsequently, an oxide layer is formed on an entire surface of the substrate so as to fill the trench, and then CMP is carried out so as to form a STI (SS7).

A last process step is forming a general transistor, in which a gate pattern is formed, and then a gate is formed through a gate etch process.

The present invention described above has an effect of naturally forming a top corner rounding without adding a new pattern process because junction leakage and isolation characteristics are improved by easily carrying out the top corner rounding in the STI process.

This application claims the benefit of Korean patent application No. P2004-01126, filed on Dec. 31, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming a shallow trench isolation (STI) of a semiconductor device, comprising:

preparing a semiconductor substrate having an active region and a field region defined thereon;

forming, in succession, a pad oxide film and a pad nitride film on the semiconductor substrate by selectively etching the pad oxide film, the nitride film and the semiconductor substrate on the field region, to form a trench;

selectively growing an epitaxial silicon layer on a surface of the trench, including forming a rounded edge at a top portion of said epitaxial silicon layer adjacent to a top opening edge of said trench;

forming a liner oxide layer on the epitaxial silicon layer; and forming a STI in the trench.

2. A method for forming a shallow trench isolation (STI) of a semiconductor device, comprising:

preparing a semiconductor substrate having an active region and a field region defined thereon;

forming, in succession, a pad oxide film and a pad nitride film on the semiconductor substrate by selectively etching the pad oxide film, the nitride film and the semiconductor substrate on the field region, to form a trench;

selectively growing an epitaxial silicon layer on a surface of the trench, including forming a rounded edge at a top portion of said epitaxial silicon layer adjacent to a top opening edge of said trench;

forming a liner oxide layer on the epitaxial silicon layer; and forming a STI in the trench wherein said selectively growing step includes not growing the epitaxial silicon layer at the top portion so as to form the rounded edge.

3. A method for forming a shallow trench isolation (STI) of a semiconductor device, comprising:

forming, in succession, a pad oxide film and a pad nitride film on a semiconductor substrate having an active region and a field region defined therein;

selectively removing portions of the pad oxide film, the nitride film and the semiconductor substrate on the field region to form a trench;

selectively growing an epitaxial silicon layer on a surface of the trench, including forming a rounded edge at a top portion of said epitaxial silicon layer adjacent to a top opening edge of said trench; and forming a liner oxide layer on the epitaxial silicon layer; and forming a STI in the trench.

* * * * *